United States Patent
Oh et al.

(10) Patent No.: US 6,467,295 B2
(45) Date of Patent: Oct. 22, 2002

(54) REFRIGERATED COOLING APPARATUS FOR SEMICONDUCTOR DEVICE

(75) Inventors: Sai Kee Oh, Seoul (KR); Dong Yeon Jang, Kyonggi-do (KR); Se Yoon Oh, Seoul (KR); Wook Yong Lee, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/966,088

(22) Filed: Oct. 1, 2001

(65) Prior Publication Data

US 2002/0066283 A1 Jun. 6, 2002

(30) Foreign Application Priority Data

Dec. 1, 2000 (KR) .......................... 2000-72428
Dec. 1, 2000 (KR) .......................... 2000-72429

(51) Int. Cl.⁷ ............................................. F25D 23/12
(52) U.S. Cl. ........................ 62/259.2; 62/119; 62/228.2
(58) Field of Search ............................. 62/259.2, 119, 62/228.2

(56) References Cited

U.S. PATENT DOCUMENTS

| | | | |
|---|---|---|---|
| 5,448,891 A | * | 9/1995 | Nakagiri et al. ............... 62/3.4 |
| 6,401,462 B1 | * | 6/2002 | Bielinski ........................ 62/3.7 |
| 2001/0005990 A1 | * | 7/2001 | Kim et al. ..................... 62/3.1 |
| 2001/0022090 A1 | * | 9/2001 | Takano et al. .............. 62/228.5 |
| 2002/0007641 A1 | * | 1/2002 | Marsala ........................ 62/119 |
| 2002/0038550 A1 | * | 4/2002 | Gillen ........................... 62/3.7 |
| 2002/0062954 A1 | * | 5/2002 | Getchel et al. .............. 165/263 |

* cited by examiner

Primary Examiner—William C. Doerrler
Assistant Examiner—Mark Shulman
(74) Attorney, Agent, or Firm—Birch, Stewart, Kolasch & Birch, LLP

(57) ABSTRACT

The present invention relates to a refrigerated cooling apparatus for cooling heat generated from a semiconductor device by forming a circulating flow path of the air in a case with an evaporator and the semiconductor mounted.

The refrigerated cooling apparatus includes a compressor for compressing a coolant at high pressure, a condenser, connected to the compressor, for condensing the coolant, an expansion valve connected to the condenser, an evaporator, connected to the expansion valve and the compressor, for evaporating the coolant, and a venting fan mounted on the evaporator, wherein the evaporator is integrally installed to the case forming a cooling space for a semiconductor device, and is connected to the compressor and the expansion valve provided on an exterior of the case through a connecting pipe; the venting fan is mounted on the evaporator to be divided from the semiconductor device; and a circulating flow path is formed in the case, so that a heat-transferred air of a low temperature absorbs a heat from the semiconductor device and flows to the evaporator.

13 Claims, 3 Drawing Sheets

REFRIGERATED COOLING APPARATUS FOR SEMICONDUCTOR DEVICE

BACKGROUND OF THE INVENTION

1. Field of the Invention

The present invention relates to a cooling apparatus for a semiconductor device, and more particularly to a refrigerated cooling apparatus for a semiconductor device capable of cooling heat of semiconductor devices using air heat-transferred in an evaporator, and being applicable to other kinds of semiconductor devices.

2. Description of the Related Art

In a typical semiconductor device comprising a diode transistor rectifier (SCR), a TRIAC, or the like, the increase of integration and the improvement of performance to process a data at a high speed causes the heating density to be increased.

Increased temperature of the semiconductor device is the reason why an interface flaking is happened at a juncture portion of the semiconductor device due to the heat expansion difference generated by a heat stress, a signal processing speed reduces, or other problems such as malfunction are happened.

In order to solve the problems, the semiconductor device is provided with a cooling apparatus to control an operation threshold temperature (a temperature of the juncture portion) of the semiconductor device.

The prior cooling apparatus 1 for a semiconductor device employs a forcible air-cooling method, as shown in FIG. 1, wherein air is forcibly circulated around the semiconductor device 10 to radiate the heat generated from the semiconductor device.

Such a forcible air-cooling apparatus 1 comprises a number of pins 11 provided on the semiconductor device 10 mounted onto the PCB 20 for easily radiating the heat through a heat transfer, and a heat radiating fan 12 rotating above the fins 11 for forcibly circulating the air by convection.

In case of reducing the temperature of the semiconductor device 10 using the heat radiating fan 12, a low frequency noise is generated due to the rotation of the heat radiating fan 12, and increased amount of heat radiation of the semiconductor device does not effectively radiate the internally generated heat through the pins 11.

Since a body case of a personal computer is provided with another ventilating fan (not shown) to supply external air to the semiconductor device and exhaust heated air therefrom, the supplied air containing dust and moisture causes the semiconductor device to be out of order.

A refrigerated cooling apparatus 2 is, as shown in FIG. 2, installed on the semiconductor device to increase the operation speed by reducing the temperature of the semiconductor device 10 or to overcome the limit of the cooling effect to be obtained by the forcible air-cooling apparatus.

The refrigerated cooling apparatus 2 comprises an evaporator 21 attached to an upper surface of the semiconductor device 10, through that a coolant of low temperature and low pressure flows, and a compressor 22 supplied with the coolant which is heat-transferred in the evaporator 21, a condenser 23, and an expansion valve 24.

Since the temperature of the evaporator 21 is in range of −20° C. to −40° C., if the air in the personal computer except for the semiconductor device to be cooled contacts with the evaporator, a frost phenomenon may be happened on the surface of the evaporator, thereby causing a serious problem in the operation of other components. Therefore, the evaporator 21 and the semiconductor device 10 are packaged after carrying out a heat insulating treatment.

The evaporator absorbs the heat generated from the CPU 10 of the personal computer using an evaporating latent heat of the coolant. If the air in the personal computer having a temperature of 40 to 50° C. contacts with the surface of the evaporator 21 of −20 to −40° C. lower than a dew point, however, the moisture contained in the air is condensed and frosted.

The refrigerated cooling apparatus 2 controls the temperature of the semiconductor device by the heat transfer due to the temperature difference between the semiconductor device and the evaporator.

Since the semiconductor device is packaged together with the evaporator 21, the construction thereof is complicated, and cannot be easily assembled.

In addition, in order to mount the cooling apparatus onto a mother board (not shown), means for connecting the cooling apparatus and the refrigerator has to be adequately provided.

Since the evaporator 21 is directly attached to the semiconductor device, in case of upgrading the semiconductor device, it is impossible to reuse the existing cooling apparatus, so that the compatibility thereof is deteriorated.

SUMMARY OF THE INVENTION

It is, therefore, an object of the present invention to provide a refrigerated cooling apparatus capable of effectively radiating the heat generated from a semiconductor device to improve an operation performance of the semiconductor device.

Other object of the present invention is to provide a refrigerated cooling apparatus capable of improving compatibility and workability, so that the apparatus can be installed, regardless of the shape of a semiconductor device or a semiconductor package.

Another object of the present invention is to provide a refrigerated cooling apparatus capable of improving a performance, by forming integrally an evaporator and a case.

To achieve the above object, there is provided a refrigerated cooling apparatus including a compressor for compressing a coolant at high pressure, a condenser, connected to the compressor, for condensing the coolant, an expansion valve connected to the condenser, an evaporator, connected to the expansion valve and the compressor, for evaporating the coolant, and a venting fan installed on the evaporator, wherein the evaporator is integrally installed to the case forming a cooling space for a semiconductor device, and is connected to the compressor and the expansion valve provided on an exterior of the case through a connecting pipe; the venting fan is mounted on the evaporator to be divided from the semiconductor device; and a circulating flow path is formed in the case, so that a heat-transferred air of a low temperature absorbs heat generated from the semiconductor device and flows to the evaporator.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

Figure 1:
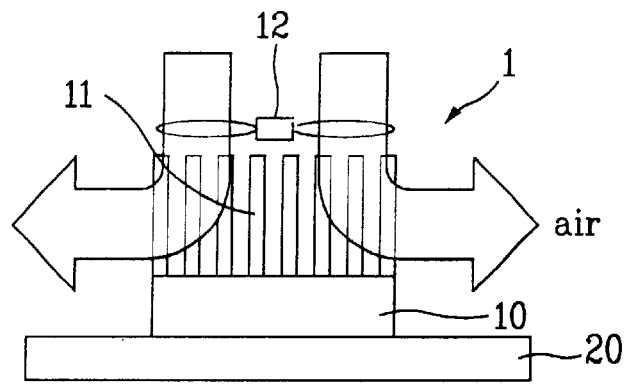
FIG. 1 is a cross sectional view illustrating the operation of a forcible air-cooling apparatus for cooling a semiconductor device according to the prior art.
Figure 2:
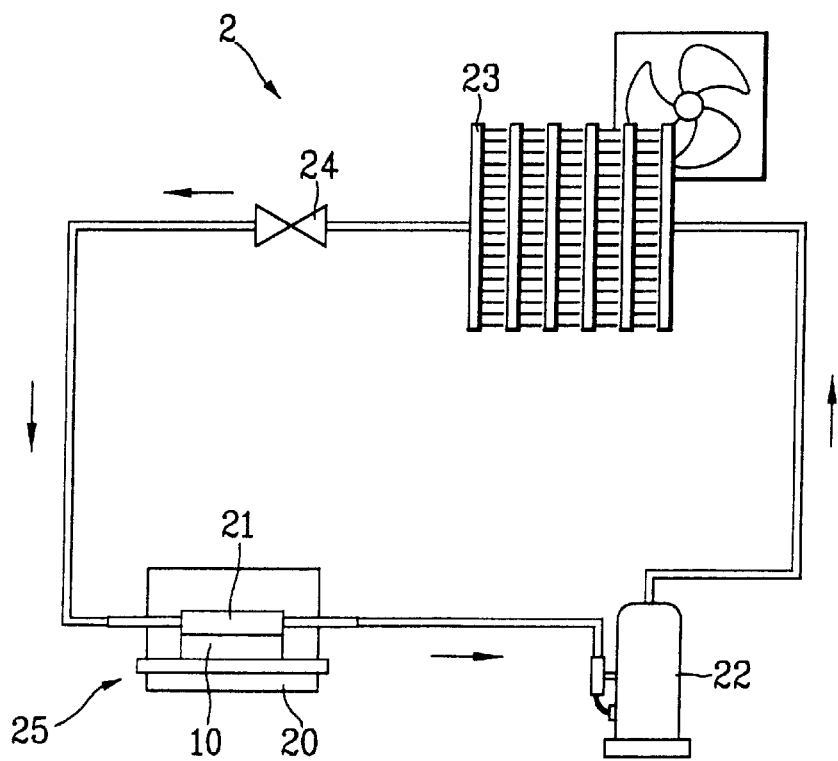
FIG. 2 is a cross sectional view illustrating a refrigerated cooling apparatus for cooling a semiconductor device according to the prior art.

Preferred embodiments of the present invention will now be described with reference to the accompanying drawings. In the following description, same drawing reference numerals are used for the same elements even in different drawings. The matters defined in the description such as a detailed construction and elements of an apparatus are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 3:
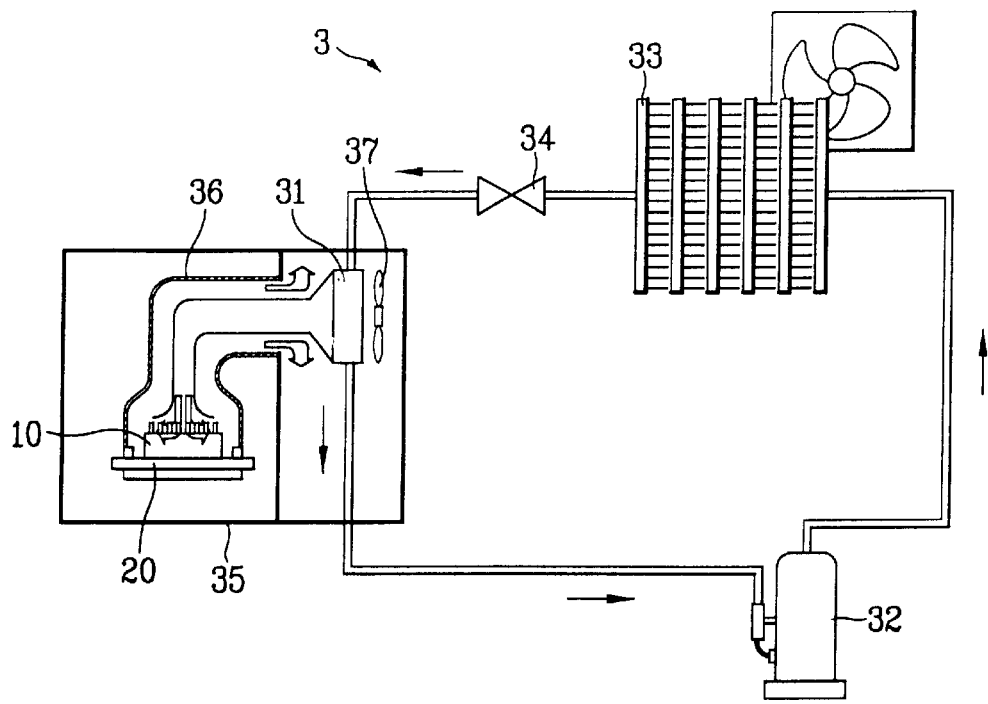
FIG. 3 is a perspective view illustrating a refrigerated cooling apparatus according to one preferred embodiment of the present invention.

The refrigerated cooling apparatus 3 according to one preferred embodiment of the present invention comprises, as shown in FIG. 3, an evaporator 31, a compressor 32, a condenser 33, an expansion valve 34, and a case 35 enclosing a semiconductor device 10 and the evaporator 31, which are mounted on an upper surface of the a printed circuit board (PCB) 20.

The case 35 is provided therein with a double duct 36 connecting the evaporator 31 and the semiconductor device 10. In particular, while the evaporator 31 is positioned on one end of an inner duct 361, the upper surface of the semiconductor device 10 is positioned on the other end thereof.

Meanwhile, an outer duct 362 has a diameter lager than that of the inner duct 361, and is positioned around an external periphery of the inner duct 361. The outer duct also has one end welded to the case 35 to communicate a venting fan 37 provided on one side of the evaporator with the semiconductor, and the other end for sealing an upper surface of the PCB 20 to enclose the semiconductor device.

Alternatively, a number of heat radiating pins 38 may be mounted on the upper surface of the semiconductor device 10.

Figure 4:
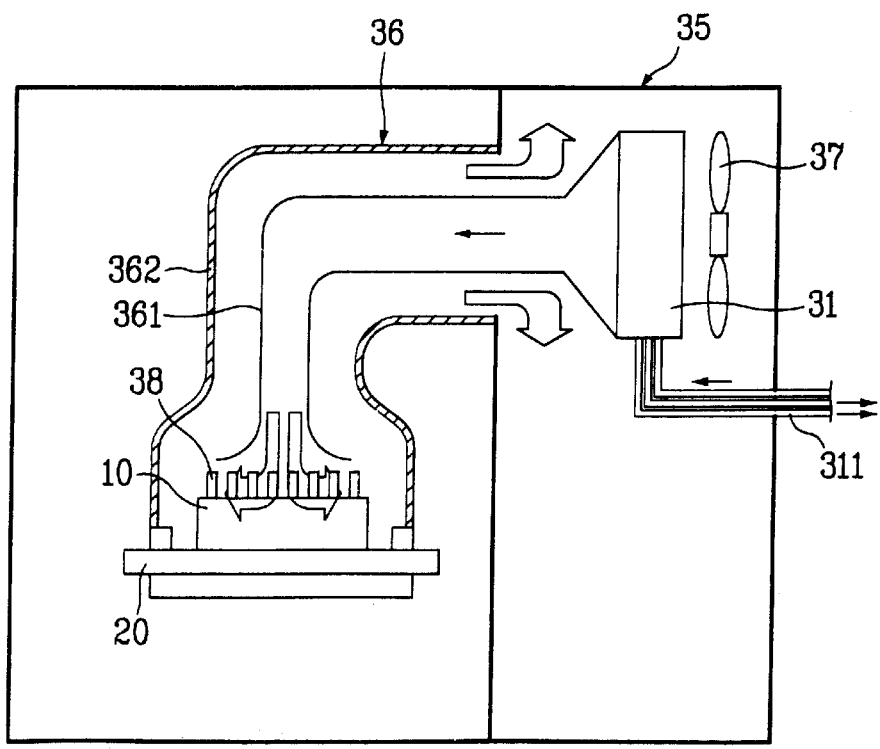
FIG. 4 is a cross sectional view illustrating an evaporating unit of the refrigerated cooling apparatus shown in FIG. 3.

With the above construction, as shown in FIG. 4, a first flow path is defined between the evaporator 31 and the semiconductor device 10 by the inner duct 361, and a second flow path is defined between the inner space of the case 35 provided with the evaporator 31 and the semiconductor device 10 by the outer duct 362.

The other end of the inner duct 361, which is positioned on the upper surface of the semiconductor device has a bottom of an increased surface area to increase a flow rate of a cooling air, so that the cooling air flows uniformly into the semiconductor device.

The double duct 36 is made of a bellows tube, a length of which is adjustable, so that the evaporator is easily provided on the semiconductor device positioned on a predetermined portion of the PCB. In order to improve the heat transfer, a heat insulating material may be applied on the outer or inner duct 362 or 361.

In addition, a contacted portion of the outer duct 362 and the PCB 20 with the semiconductor device 10 mounted is enclosed and sealed with a heat insulating material.

If the cooling air of 1 to 10° contacts with the interior air within the case, a frost phenomenon may be happened in the case, thereby causing a serious problem on the operation to other components. Therefore, the contacted portion has to be insulated to supply the cooling air to the evaporator 31 and the semiconductor device 10 only.

The venting fan 37 for forcibly supplying the air within the case into the evaporator 31 may be positioned on a rear or downstream end of the evaporator 31, an inlet of the inner duct 361, or an outlet of the outer duct 362.

The condensed water discharged from the evaporator 31 is guided to the cooling apparatus to be supplied into a condensed water discharging pipe 311.

If the refrigerated cooling apparatus 3 according to one preferred embodiment of the present invention operates to carry out the cooling of the semiconductor device 10, the coolant is compressed at a high temperature and a high pressure by the compressor 32, and is condensed by a heat transfer through the condenser 33. And then, the condensed coolant is expanded at a low temperature and a low pressure through the expansion valve 34, and flows into the evaporator 31.

The rotation of the venting fan 37 provided on one side of the evaporator 31 causes the air within the case to flow forcibly into the evaporator. The cooled air passing through the evaporator is guided to the semiconductor device 10 along a flow path of the inner duct 361.

After the air of a low temperature is sprayed over the semiconductor device 10 to absorb the heat radiated from the semiconductor device 10, the air returns into the evaporator 31 along the outer duct 362 by the forcible convection happened due to the rotation of the venting fan 37.

At that time, if the temperature of the evaporator is within a range of −20° C. to −40° C., the moisture contained in the air is frosted on the surface of the evaporator at the initial operating stage of the cooling apparatus. In order to prevent the above phenomenon, the evaporator 31 is set to have a temperature of a proper range capable of effectively performing the heat transfer, and preferably is set to have a temperature of above 0° C.

In addition, the frost phenomenon is prevented from being happened within the flow path and the personal computer by applying the heat insulating material on the outer peripheries of the outer and inner ducts 362 and 361.

Further, the sealant and the heat insulating material are applied onto the contacted portion of the outer duct 362 and the PCB 20 to prevent the discharge and frost of the cooled air. And, the heat insulating material is attached under the PCB.

When the refrigerated cooling apparatus 3 of the present invention operates continuously, since the air circulates within the case that is isolated from the external air, the continued operation causes the moisture contained in the air to be frosted on the surface of the evaporator 31 and changed into the condensed water. Therefore, the humidity within the case with the evaporator provided therein is significantly lowered, thereby eliminating the frost possibility in the inner duct.

Meanwhile, in case that the refrigerated cooling apparatus 4 according to another preferred embodiment of the present invention is applied to the inner of the personal computer to cool the heat generated from a CPU or cards, the refrigerated cooling apparatus is constructed as following.

Figure 5:
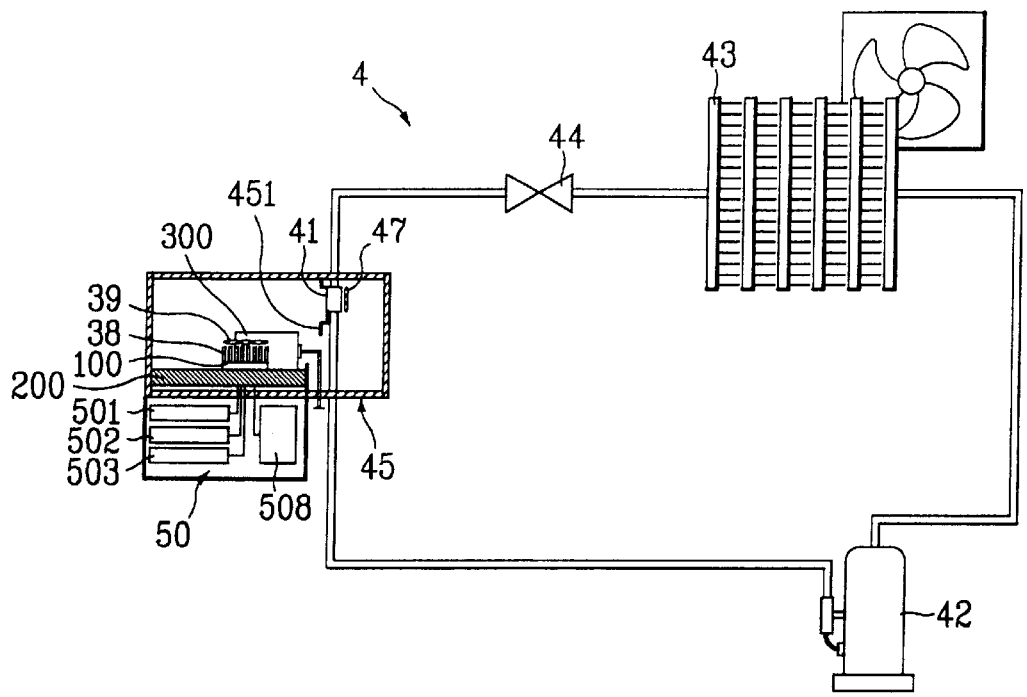
FIG. 5 is a perspective view illustrating a refrigerated cooling apparatus according to another preferred embodiment of the present invention, the refrigerated cooling apparatus being provided on a personal computer.

The refrigerated cooling apparatus 4 comprises, as shown in FIG. 5, an evaporator 41, a compressor 42, a condenser 43, an expansion valve 44, and a case 45. A venting fan 47 is provided on one side of the evaporator, and the evaporator is positioned in the case 45, so that the evaporator is divided from other cooling apparatus to form a cooling space.

Figure 6:
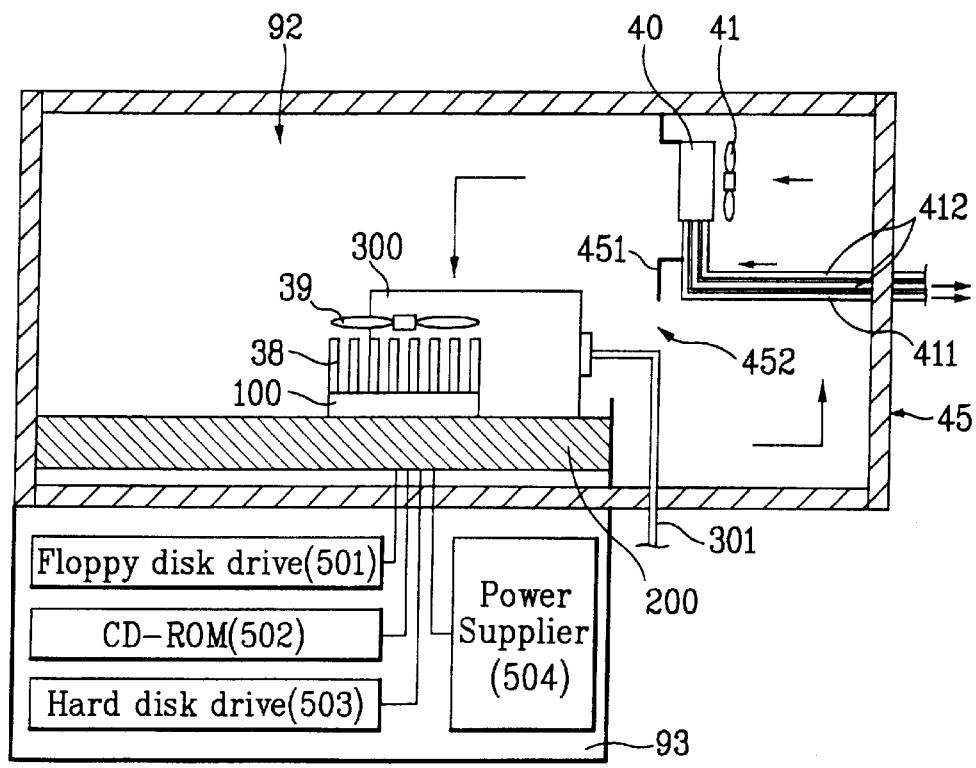
FIG. 6 is a cross sectional view illustrating an evaporating unit of the refrigerated cooling apparatus shown in FIG. 5.

As shown in FIG. 6, the case 45 is provided therein with a CPU 100, a main board 200 with the CPU 100 mounted thereon, cards 300. The venting fan 47 in the case is divided from the above components by a partition 451, and the evaporator 41 is integrally formed with the case to communicate the space of the CPU with the space of the venting fan.

A venting hole 452 is formed on a bottom of the partition 451 to connect the cards 300 mounted onto the main board 200 and the peripheral provided on the outer of the case 45.

In order to prevent the air to be circulated in the case from being outwardly leaked, a connecting wire 301 connecting the cards 300 mounted onto the main board 200 to the peripheral is fastened in the interior space of the case, and communicates the CPU 100 or the venting fan with the exterior of the personal computer.

A space 50 for receiving input/output apparatus, such as a floppy disk drive 501, a CD-ROM 502, a hard disk drive 503, a power supply 504 or the like, positioned under the main board 200 is divided from the main board 200 by the case 45 made of a heat insulating material and a sealant.

The CPU 100 and the disk drive 501 are connected to a data bus through a power line.

The condenser 43, the compressor 42, and the expansion valve 44 are provided in the personal computer, with those being divided from the evaporator 41. The evaporator 41, the CPU 100 or the main board 200 to be cooled, and the cards 300 are mounted in the case 45 to be insulated from other space of the personal computer.

The data bus and the power line connecting the main board 200 and the space 50 for receiving the input/output apparatus are insulated and sealed to prevent the air from flowing between those, so that the air of the case 45 is not discharged outwardly, but circulated in the case 45.

In order to more smoothly circulate the air in the case 45 of the cooling apparatus according to the present invention, a heat radiating fan 3a may be mounted onto the CPU of the personal computer, and a number of pins 38 may be mounted onto the upper surface of the CPU 100 to radiate the heat.

If the venting fan 47 mounted onto one side of the evaporator 41 in the case rotates the air at the venting fan is heat-transferred to be cooled, and then flows into the CPU 100.

The cooled air is sprayed over the components radiating the heat such as the CPU 100, so that the heat transfer between the components and the cooled air is performed to cool the components. And then, the air absorbing the heat flows again into the venting fan through the venting hole 452 formed on the partition 451 in the case 45.

Meanwhile, when the evaporator 41 in the case 45 operates initially, the condensed water which is generated by the heat transfer with the coolant is discharged to the compressor 42 through a condensed water discharging pipe 411 under the evaporator 41, and then is sprayed over the compressor 42 generating the heat or over the surface of the evaporator 43 to be performed the heat transfer effectively.

The condensed water discharging pipe 411 and a coolant pipe 412 connected to the evaporator are insulated and sealed to prevent the condensed water being dropped to other components of the personal computer positioned on the outside of the case 45.

With the construction of the refrigerated cooling apparatus according to the present invention, the evaporator is integrally provided on the case formed of the heat insulating material or the sealant, and the CPU, the main board, and the cards are mounted in the case, so that several components may be effectively and simultaneously cooled. The air within the case is continuously circulated, thereby effectively performing the cooling of the components, reducing the consumption of the energy, and improving the performance of the personal computer.

The pipes connected the case to the exterior is insulated and sealed, thereby preventing components from being get out of order due to the condensed water.

In addition, since the cooling apparatus is separated from components of the personal computer, the cooling apparatus may be easily installed. Also, when components are replaced, the cooling apparatus has not to be replaced.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A refrigerated cooling apparatus including a compressor for compressing a coolant at high pressure, a condenser, connected to the compressor, for condensing the coolant, an expansion valve connected to the condenser, an evaporator, connected to the expansion valve and the compressor, for evaporating the coolant, and a venting fan mounted on the evaporator, wherein the evaporator is integrally installed to the case forming a cooling space for a semiconductor device, and is connected to the compressor and the expansion valve provided on an exterior of the case through a connecting pipe;

the venting fan is mounted on the evaporator to be divided from the semiconductor device; and a circulating flow path is formed in the case, so that a heat-transferred air of a low temperature absorbs heat generated from the semiconductor device and flows to the evaporator.

2. The apparatus of claim 1, wherein a double duct consisting of an inner duct and an outer duct is provided between the evaporator and the semiconductor device to form the circulating flow path, the inner duct connects the evaporator and the semiconductor to form a first flow path, through which the air of a low temperature flows to the semiconductor device, and the outer duct connects the semiconductor device and a space receiving the venting fan to form a second flow path, through which the air absorbing the heat from the semiconductor device is forcibly supplied to the evaporator by the venting fan.

3. The apparatus of claim 1, wherein a partition is installed in the case to form a circulating flow path, through which the air of a low temperature heat-transferred in the evaporator flows to the semiconductor device, and the air absorbing the hear from the semiconductor device flows to the evaporator; and wherein a through hole is formed at an upper and lower portion of the partition, respectively, and the evaporator is mounted onto the upper through hole.

4. The apparatus of claim 1, wherein the case is made of a heat insulating material and a sealant.

5. The apparatus of claim 1, wherein an evaporating temperature of the evaporator is set to above 0 ° C.

6. The apparatus of claim 1 or 2, wherein the venting fan is installed on a rear or downstream portion of the evaporator.

7. The apparatus of claim 2, wherein the double duct has a bellows structure.

8. The apparatus of claim 2, wherein the inner duct is applied with a heat insulating material.

9. The apparatus of claim 2, wherein a contacted surface of the outer duct and a fixing board with the semiconductor device mounted thereon is enclosed and sealed by a heat insulating material.

10. The apparatus of claim 1, wherein in order to prevent the air to be circulated in the case from being outwardly leaked, a connecting wire connecting the semiconductor device and an peripheral is fastened in an interior space of the case, and is connected to an exterior of a personal computer.

11. The apparatus of claim 1, wherein a space for receiving input/output apparatus, such as, a floppy disk drive, a hard disk drive, a power supply or the like, positioned under a PCB is divided from the PCB by the case made of a heat insulating material and a sealant.

12. The apparatus of claim 1, wherein a connecting pipe connecting the evaporator, the compressor, and the expansion valve is insulated and sealed.

13. The apparatus of claim 1, wherein a condensed water discharged from the evaporator is sprayed over the compressor or the condenser.

* * * * *